United States Patent
Duban-Hu et al.

(10) Patent No.: US 6,857,524 B2
(45) Date of Patent: Feb. 22, 2005

(54) TRAY FOR SEMICONDUCTORS

(75) Inventors: Joy Duban-Hu, Burnsville, MN (US); James Nigg, Howard Lake, MN (US)

(73) Assignee: Entegris, Inc., Chaska, MN (US)

( * ) Notice: Subject to any disclaimer, the term of this patent is extended or adjusted under 35 U.S.C. 154(b) by 0 days.

(21) Appl. No.: 10/194,948

(22) Filed: Jul. 12, 2002

(65) Prior Publication Data

US 2003/0026083 A1 Feb. 6, 2003

Related U.S. Application Data

(60) Provisional application No. 60/305,785, filed on Jul. 15, 2001.

(51) Int. Cl.⁷ ............................................... B65D 73/02
(52) U.S. Cl. ...................................... 206/725; 206/564
(58) Field of Search ................................ 206/701, 706, 206/707, 710, 711, 722, 723, 725, 508, 511, 564; 220/324, 326

(56) References Cited

U.S. PATENT DOCUMENTS

| | | | |
|---|---|---|---|
| 3,494,459 A | | 2/1970 | Wallestad |
| 5,481,438 A | | 1/1996 | Nemoto |
| 5,660,280 A | | 8/1997 | Wiederhold et al. |
| 5,706,951 A | * | 1/1998 | Oinuma et al. ............. 206/710 |
| 5,909,812 A | * | 6/1999 | Thibaudeau ................ 206/722 |
| 5,957,293 A | | 9/1999 | Pakeriasamy |
| 6,079,565 A | * | 6/2000 | Walsh et al. ................ 206/725 |
| 6,296,122 B1 | * | 10/2001 | Nakazono et al. .......... 206/725 |

* cited by examiner

*Primary Examiner*—Luan K. Bui
(74) *Attorney, Agent, or Firm*—Patterson, Thuente, Skaar & Christensen, P.A.

(57) ABSTRACT

A tray for semiconductors having a tray portion, a rail portion, and an intermediate portion. The tray portion has a plurality of chip recesses formed therein. The rail portion extends substantially around the tray portion. The intermediate portion interconnects the tray portion and the rail portion and is oriented at an angle of more than 115° with respect to the rail portion.

12 Claims, 12 Drawing Sheets

TRAY FOR SEMICONDUCTORS

REFERENCE TO RELATED APPLICATION

This application claims benefit to the filing date of U.S. Provisional Application Ser. No. 60/305,785, filed Jul. 15, 2001. This application is hereby incorporated by reference.

FIELD OF THE INVENTION

The present invention relates generally to trays for use during the manufacture of semiconductors. More particularly, the present invention is directed to a tray for use in transporting semiconductors during the manufacture of semiconductors.

BACKGROUND OF THE INVENTION

During the manufacture of semiconductors, a large number of integrated circuits are normally manufactured on a single substrate. Thereafter, the substrate is separated to form individual integrated circuit chips. The integrated circuit chips are easily damaged if not handled properly.

Packaging systems have been developed to protect the integrated circuit chips during the manufacture process. These packaging systems are typically manufactured from a non-metallic material that will tend to cushion the chip to minimize physical damage to the chip and that will not react in any manner with the chip.

One such packaging system is described in Wallestad, U.S. Pat. No. 3,494,459, which is assigned to the assignee of the present application. The Wallestad packaging system patent includes a plurality of chip trays. Each of the chip trays has a plurality of recesses formed therein that are each adapted to receive one of the integrated circuit chips. The chip trays are stackable to facilitate transporting the integrated circuit chips in a relatively dense configuration.

The chip trays include a tray portion and a rail portion. The tray portion is where the chip recesses are located. The rail portion extends around the tray portion. The rail portion is located below the tray portion to thereby define a recess in a lower surface of the chip tray. The recess is adapted to receive the tray portion from a lower chip tray to facilitate stacking of the chip trays by positioning chip trays on top of each other.

Nemoto, U.S. Pat. No. 5,481,438, discloses a tray for semiconductors that is particularly suited for semiconductors that have several leads extending therefrom. The Nemoto device includes an upwardly extending frame around the region where the semiconductor is stored. The Nemoto device also includes a rail that extends around the tray. This rail connects directly to the base.

SUMMARY OF THE INVENTION

An embodiment of the present invention is directed to a chip tray for semiconductors. The chip tray has a tray portion and a rail portion that extends around the tray portion. The tray portion and the rail portion are interconnected with an intermediate portion that is oriented at an obtuse angle with respect to the rail portion.

Another embodiment of the present invention is directed to a chip tray assembly that has a plurality of chip trays in a stacked orientation. Still other embodiments of the present invention are directed to methods of forming a tray for semiconductors. Yet other embodiments of the present invention are directed to spring boxes and storage containers for use with the chip trays.

DETAILED DESCRIPTION OF THE PREFERRED EMBODIMENTS

Figure 1:
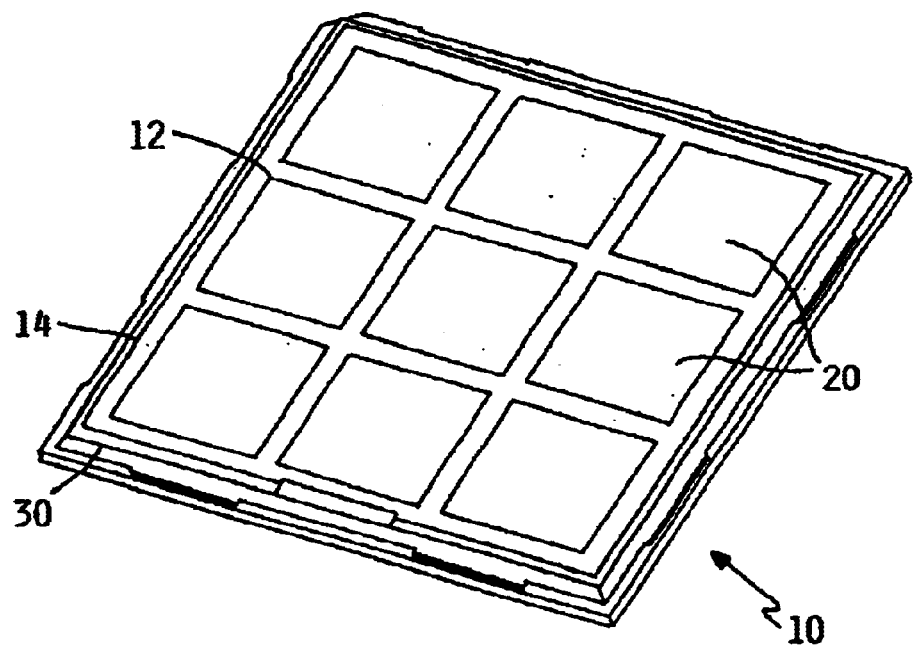
FIG. 1 is a perspective view of a chip tray according to the present invention.
Figure 2:
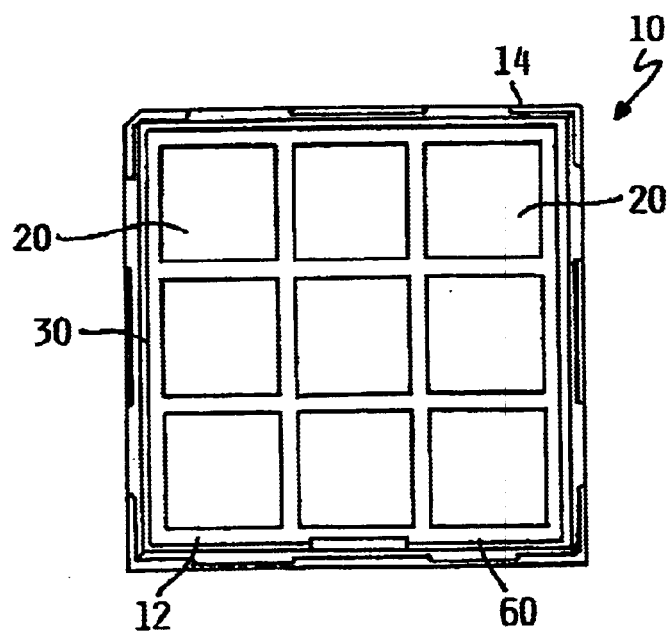
FIG. 2 is a top view of the chip tray.
Figure 3:
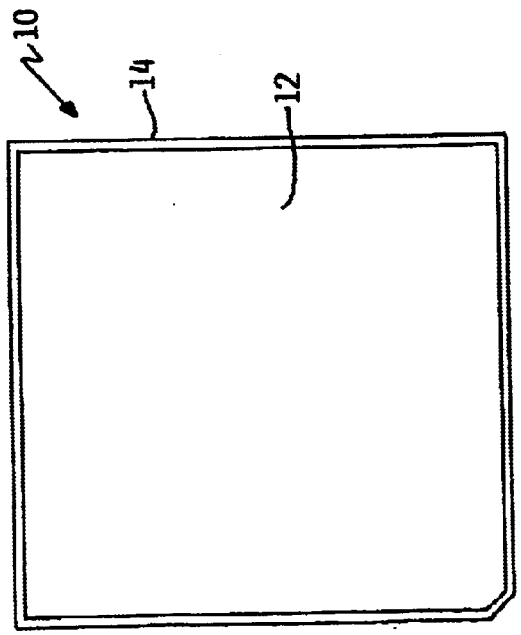
FIG. 3 is a bottom view of the chip tray.
Figure 4:
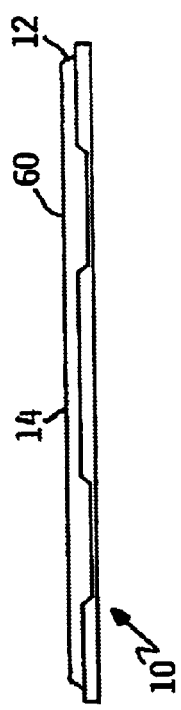
FIG. 4 is a side view of the chip tray.

An embodiment of the present invention is directed to a chip tray for semiconductors, as most clearly illustrated at 10 in FIGS. 1–9. The chip tray 10 generally includes a tray portion 12 and a rail portion 14.

The tray portion 12 includes a plurality of chip recesses 20 formed therein. Each of the chip recesses 20 is adapted to receive an integrated circuit chip (not shown). The chip recesses 20 are preferably selected with a length, width and depth that substantially corresponds with a length, width and depth of the integrated circuit chip to minimize movement of the integrated circuit chip with the chip recess 20.

The chip recesses 20 are preferably oriented in a plurality of rows and columns to facilitate removing the integrated circuit chips from the chip recesses 20 with automated equipment. The number of chip recesses 20 in each row and column is selected based upon the size of the tray portion 12 and the size of the integrated circuit chips.

Figure 5:
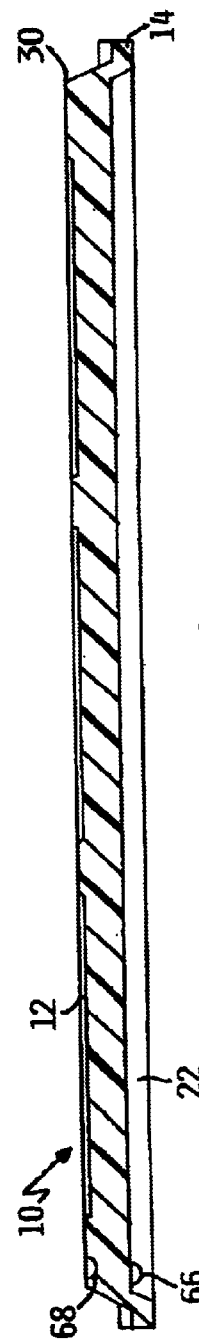
FIG. 5 is a sectional view of the chip tray taken along a line 5—5 in FIG. 2.
Figure 6:
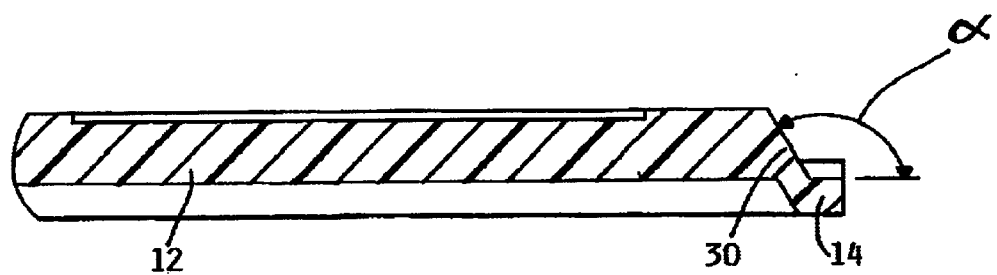
FIG. 6 is an enlarged sectional view of the chip tray illustrating interconnection of the tray portion and rail portion with the intermediate portion.
Figure 7:
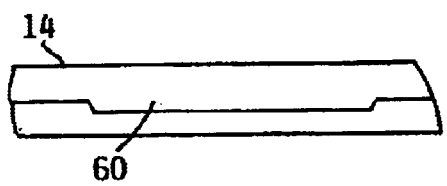
FIG. 7 is a side view of a different height region on the rail portion.
Figure 8:
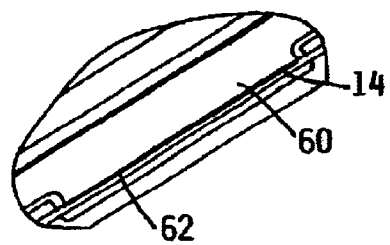
FIG. 8 is a top view of the different height region on the rail portion.

The tray portion 12 is located above the rail portion 14 such that a tray recess 22 is formed on a lower surface of the chip tray 10, as most clearly illustrated in FIG. 5. The tray recess 22 facilitates stacking of chip trays 10 as the tray portion 12 from a lower tray seats in the tray recess 22 on an upper chip tray 10. When in the stacked orientation, a lower surface of the upper chip tray 10 is located proximate the upper surface of the lower chip tray 10 to retain the integrated circuit chips in the chip recess 20.

Extending between the tray portion 12 and the rail portion 14 is an intermediate portion 30. The intermediate portion 30 is oriented at an obtuse angle α with respect to the rail portion. The angle α is preferably more than 115°. More preferably the angle a is between about 115° and 150°. Most preferably, the angle α is about 120°.

Using the angularly oriented intermediate portion 30 reduces deformation in the chip tray 10 caused by shrinkage during cooling by the rail portion 14 pulling down on the perimeter of the tray portion 12. The tolerance in the top surface of the chip tray 10 is typically within 0.008 inches for α4-inch chip tray 10. Using the structure of the present invention reduces the tolerance to within 0.004 inches, which is desirable when using the chip trays with automated processing equipment. Previously it was only possible to obtain tolerances of less than 0.004 inches with 2-inch chip trays. This configuration is in contrast to conventional chip trays where the intermediate portion is substantially perpendicular to both the tray portion and the rail portion.

The rail portion 14 along each side of the chip tray 10 preferably includes at least one region 60 having a height that is different than a height of the other areas of the rail portion 14, as illustrated in FIGS. 1, 2, 4, 7 and 8. It is has been found that forming the rail with the different height region 60 enhances the quality of the chip tray 10.

While it is possible for the different height region 60 to be lower or higher than the other parts of the rail portion 14, the different height region 60 is preferably a recess.

The different height region 60 preferably is less than about 80 percent of the other parts of the rail portion 14. More preferably, the different height regions are between 50 percent and 80 percent of the other parts of the rail portion 14. Most preferably, the different height regions are about 66 percent of the other parts of the rail portion 14.

The different height region 60 preferably encompasses more than 25 percent of the rail portion 14. More preferably, the different height region 60 encompasses between 25 percent and 50 percent of the rail portion 14. Most preferably, the different height region 60 encompasses about 33 percent of the rail portion 14.

The different height regions 60 each preferably have a length of less than one inch. More preferably, the different height regions 60 each have a length of between 0.50 and 0.80 inches. The different height regions 60 are preferably equally spaced along the rail portions 14.

During the molding process, the different height region 60 causes a path of the molten material used to fabricate the chip tray 10 to become more turbulent. This turbulent flow enhances the ability to fill all portions of a chip tray mold with the molten material, which thereby produces a higher quality chip tray 10 with fewer defects and flatter surfaces. Such a process reduces what is commonly referred to as race tracking where the molten material just moves along the rail portion 14.

As discussed above, providing the chip tray more flatter surfaces enhances the ability to use automated devices for loading the integrated circuit chips into and out of the chip tray 10. The different height region 60 also provides the ability to include indicia 62 such as the company name, product name or part number, as most clearly illustrated in FIG. 8.

As a result of the angled intermediate portion 30, the chip tray 10 has a slightly larger size than prior chip trays 10. For example, the recess 22 on the chip tray 10 of the present invention has a length and width of about 3.71 inches in contrast to the recess on a conventional chip tray, which has a length and a width of about 3.66 inches.

To enable the chip tray 10 to be used with existing jigs, the chip tray 10 includes a nub or rib 66 extending from a lower surface of the chip portion 12, as most clearly illustrated in FIG. 5. The top surface of the chip portion 12 also preferably includes a recess 68 formed therein that is shaped substantially the same as the nub or rib 66 so that the recess 68 can receive the nub or rib 66 when the chip trays 10 are stacked.

Figure 9:
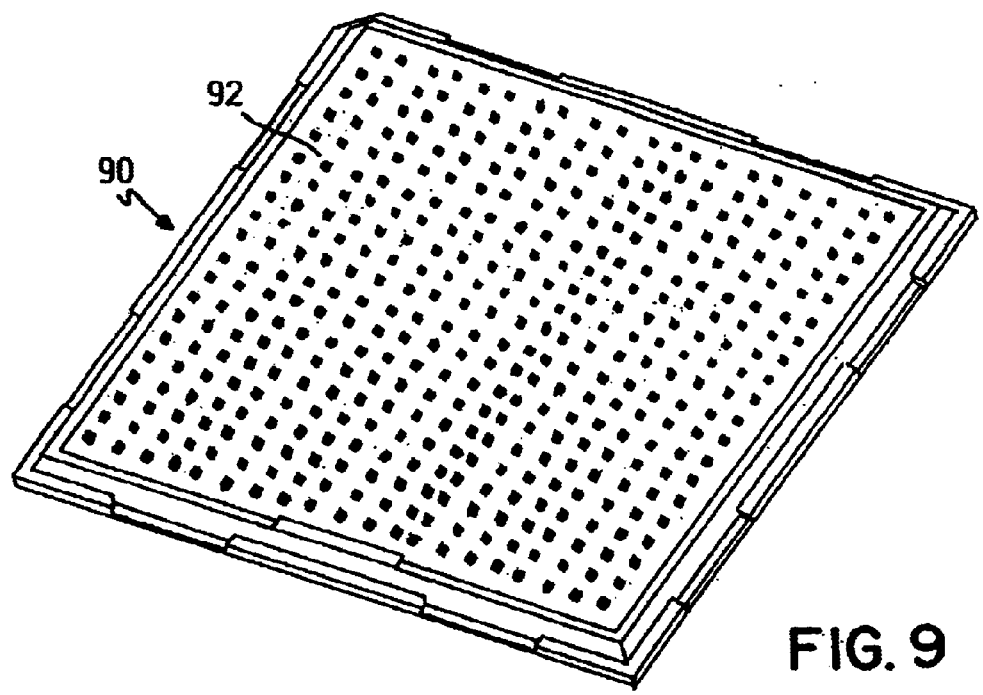
FIG. 9 is a perspective view of an alternative embodiment of the chip tray.
Figure 10:
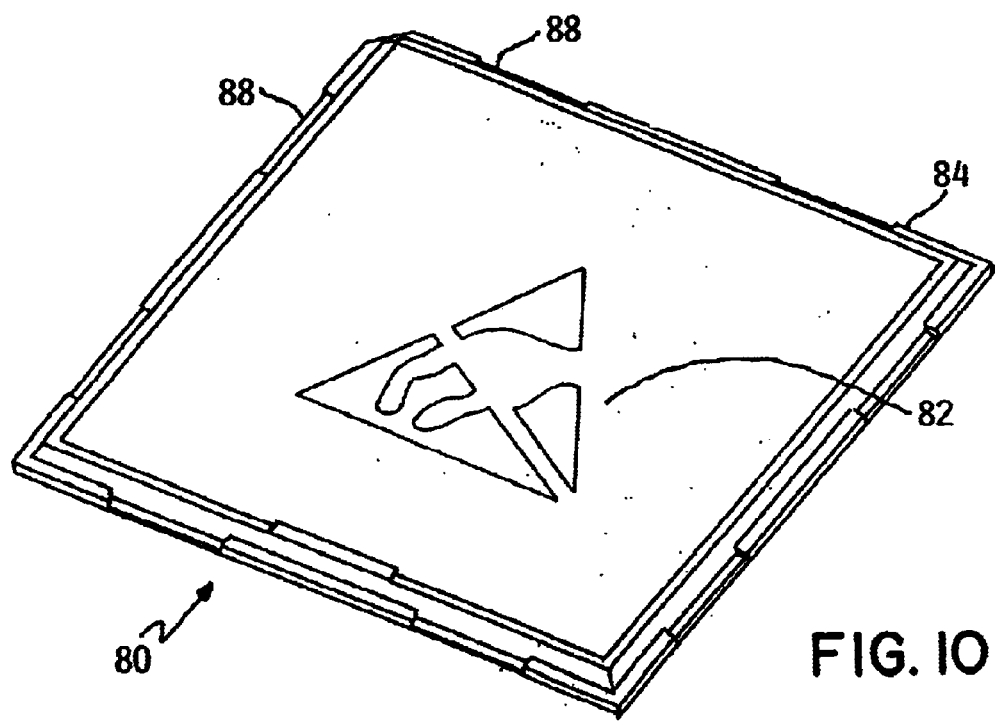
FIG. 10 is a perspective view of a chip tray cover.
Figure 11:
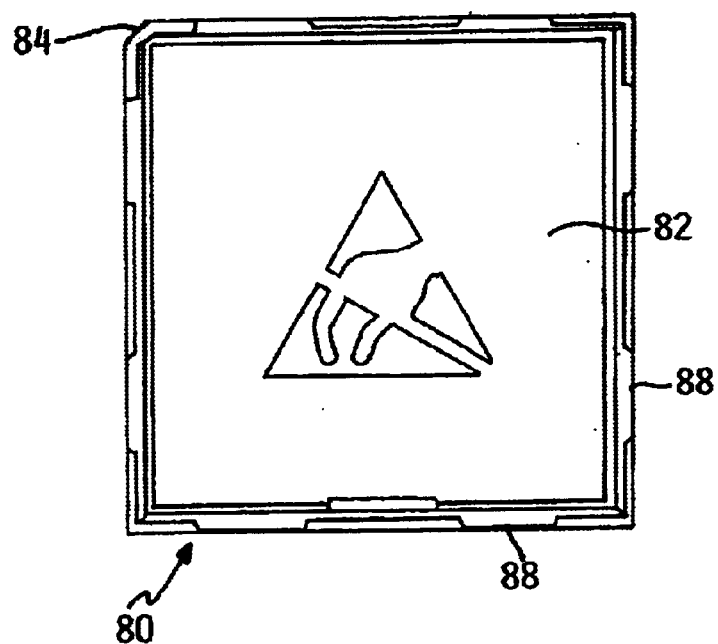
FIG. 11 is a top view of the chip tray cover.
Figure 12:
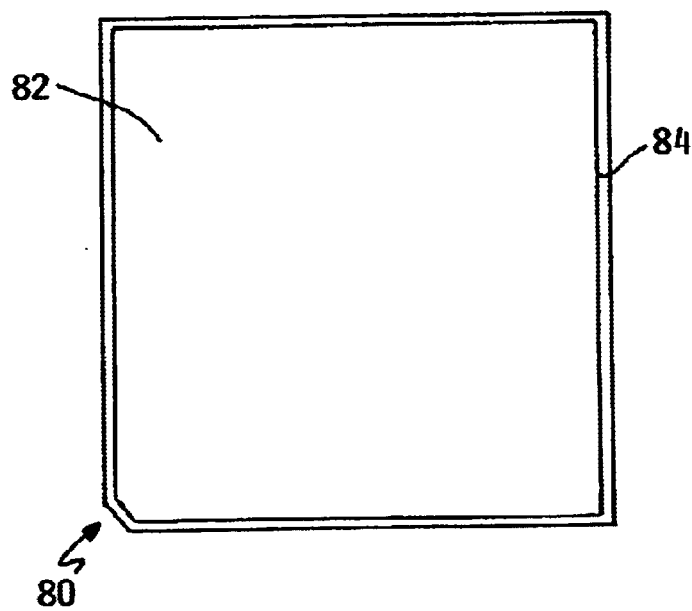
FIG. 12 is a bottom view of the chip tray cover.
Figure 15:
FIG. 15 is an enlarged sectional view of the chip tray illustrating interconnection of the central portion and rail portion with the intermediate portion.
Figure 13:
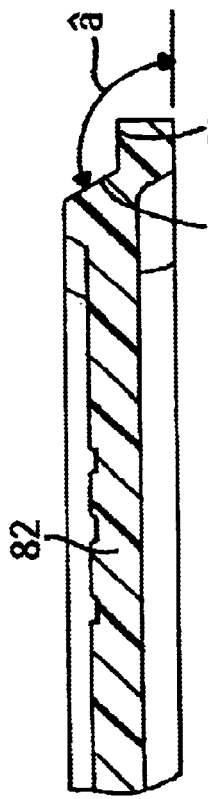
FIG. 13 is a side view of the chip tray cover.
Figure 14:
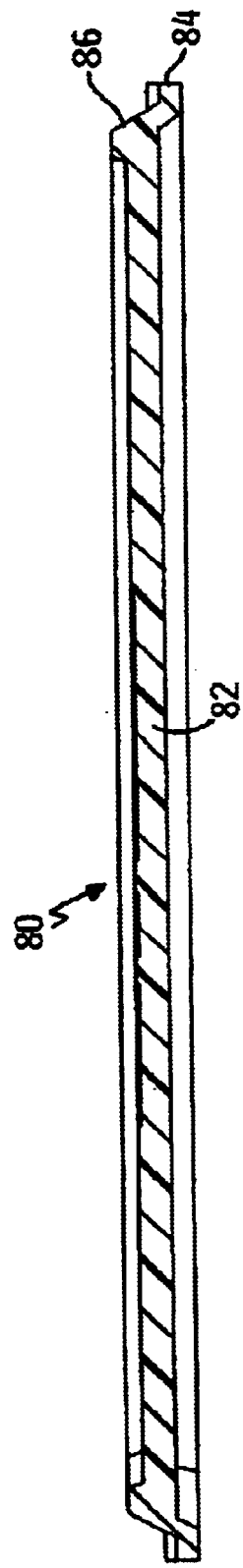
FIG. 14 is a sectional view of the chip tray cover taken along a line 14—14 in FIG. 11.
Figure 16:
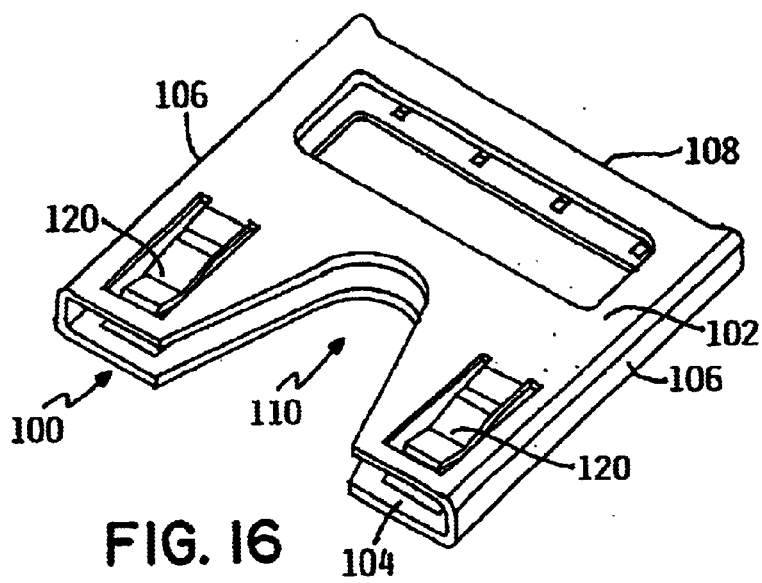
FIG. 16 is a perspective view of a spring box.
Figure 17:
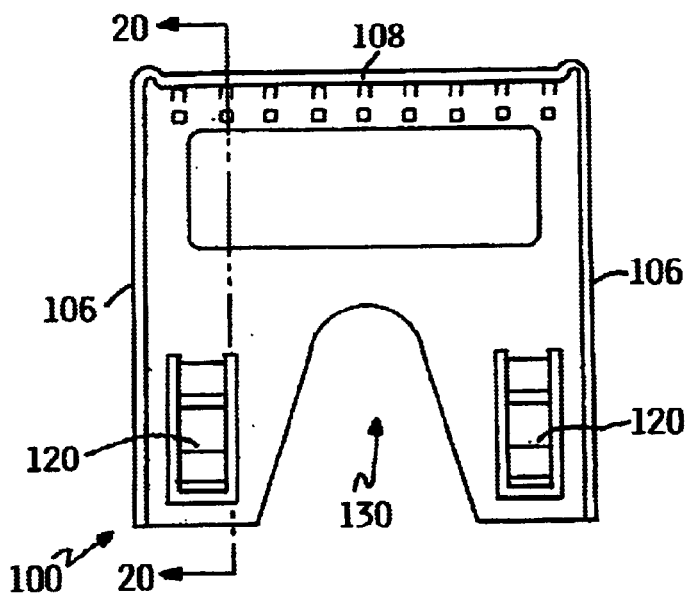
FIG. 17 is a top view of the spring box in FIG. 16.
Figure 18:
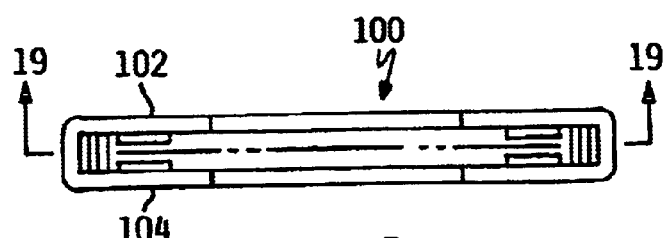
FIG. 18 is a side view of the spring box in FIG. 16.
Figure 19:
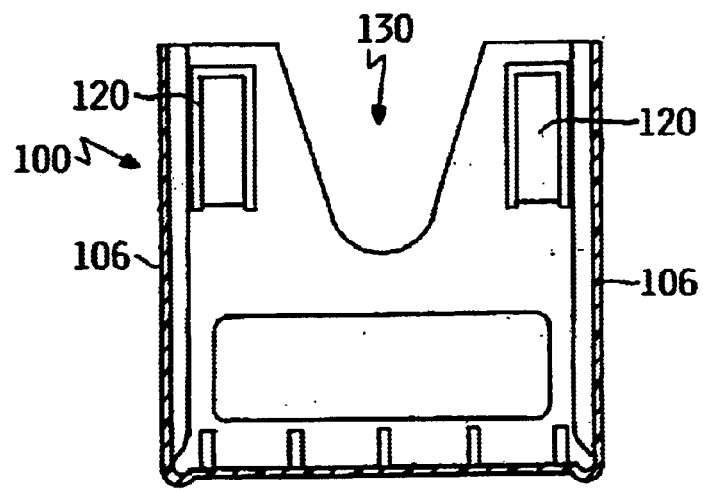
FIG. 19 is a sectional view of the spring box taken along a line 19—19 in FIG. 18.
Figure 20:
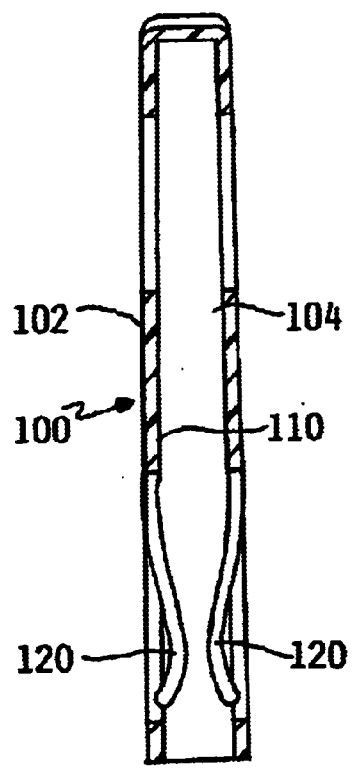
FIG. 20 is a sectional view of the spring box taken along a line 20—20 in FIG. 17.
Figure 21:
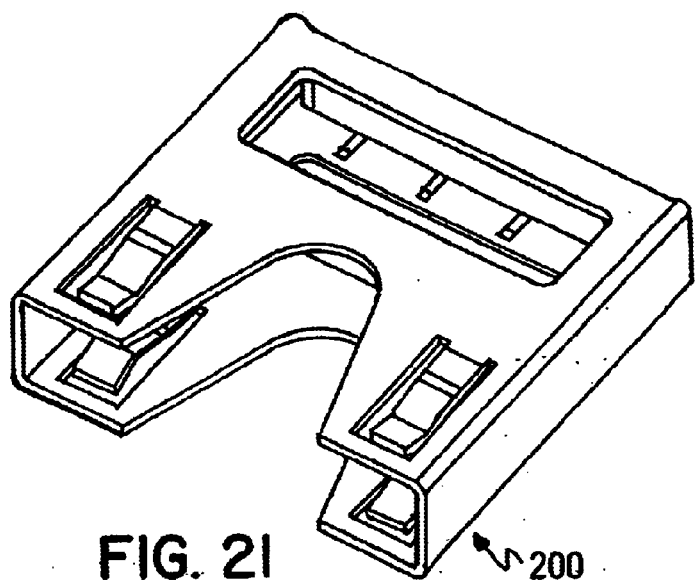
FIG. 21 is a perspective view of an alternative embodiment of the spring box.
Figure 22:
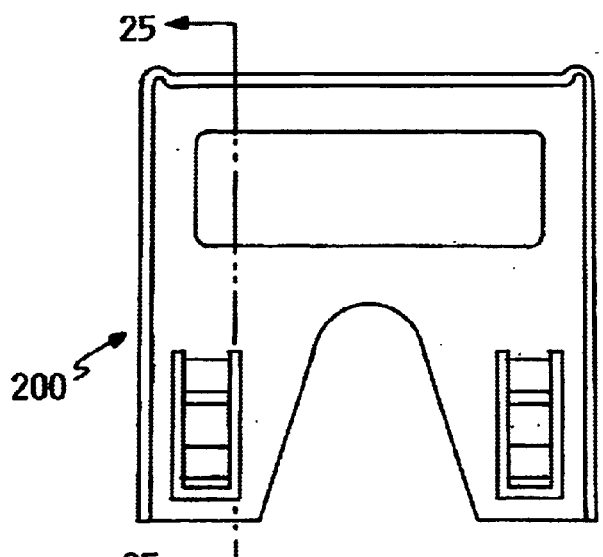
FIG. 22 is a top view of the spring box in FIG. 21.
Figure 23:
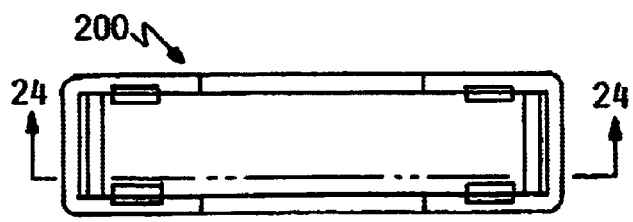
FIG. 23 is a side view of the spring box in FIG. 21.
Figure 24:
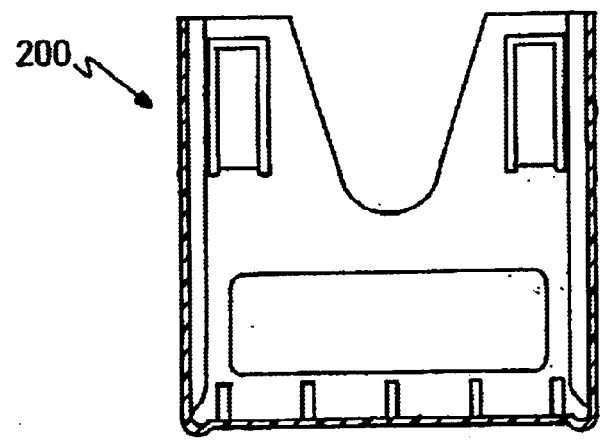
FIG. 24 is a sectional view of the spring box taken along a line 24—24 in FIG. 23.
Figure 25:
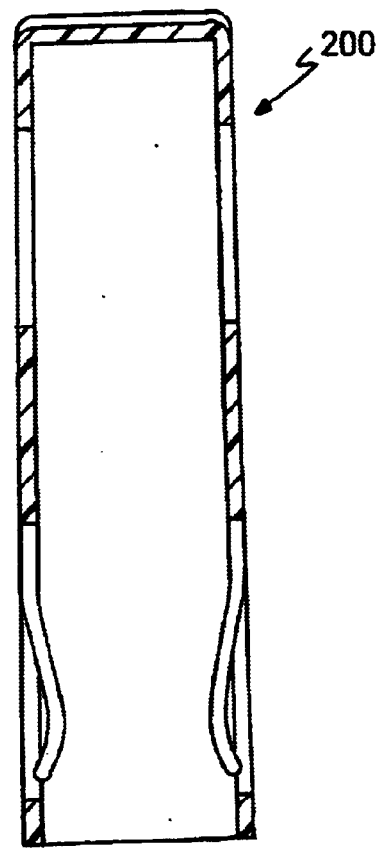
FIG. 25 is a sectional view of the spring box taken along a line 25—25 in FIG. 22.
Figure 26:
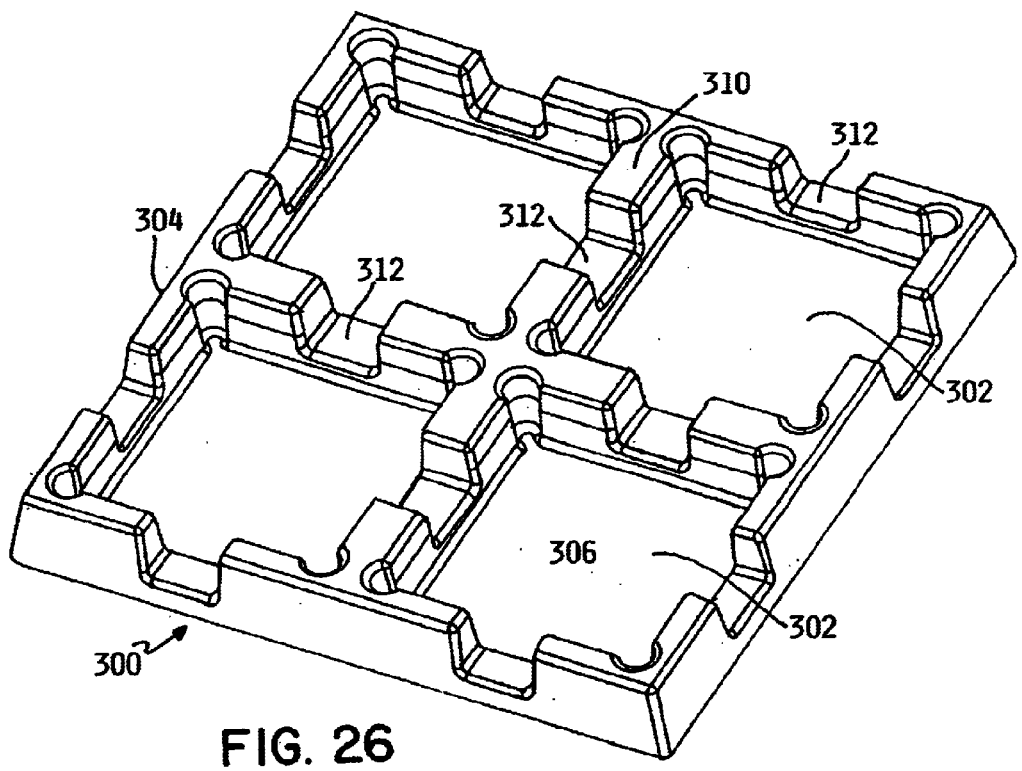
FIG. 26 is a perspective view of storage container.
Figure 27:
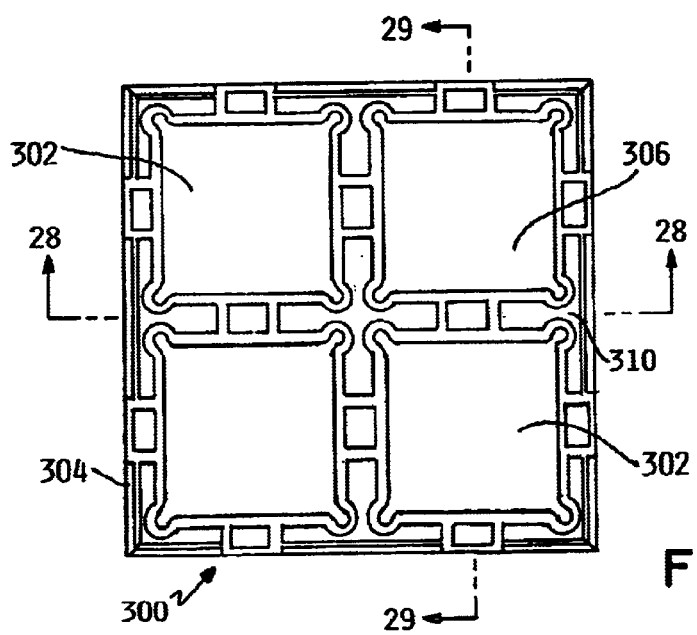
FIG. 27 is a top view of the storage container.
Figure 28:
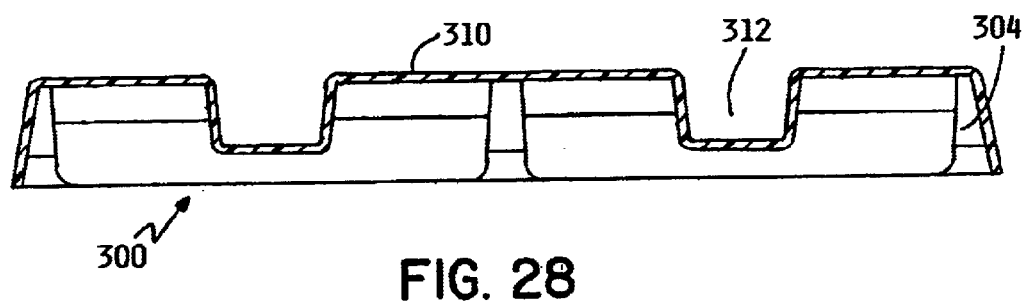
FIG. 28 is a sectional view of the storage container taken along a line 28—28 in FIG. 27.
Figure 29:
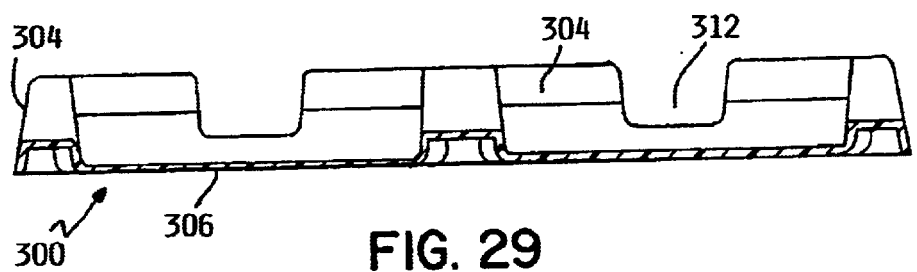
FIG. 29 is a sectional view of the storage container taken along a line 29—29 in FIG. 27.
Figure 30:
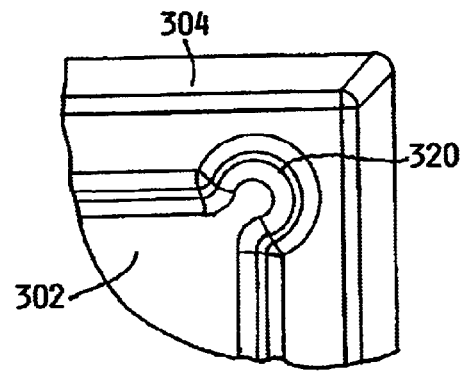
FIG. 30 is an enlarged view of a corner portion of the storage container.

Another embodiment of the chip tray is illustrated at 90 in FIG. 9. This embodiment of the chip tray 90 has a structure that is similar to the chip tray 10 illustrated in FIGS. 1–8 except that it includes a larger number of chip recesses 92.

Another embodiment of the present invention relates to a chip tray assembly that includes a plurality of chip trays, such as illustrated in FIGS. 1–8, and a cover as illustrated at 80 in FIGS. 10–15. Similar to the chip tray 10 illustrated in FIGS. 1–8, the cover 80 includes a central portion 82 and a rail portion 84 that extends around the central portion 82. The rail portion 84 is interconnected to the central portion 82 with an intermediate portion 86 that is oriented at an obtuse angle β with respect to the rail portion 84. The angle β used in the cover is approximately the same as the angle α used in the chip tray 10. This configuration permits the cover 80 to seat against the chip tray 10 in the chip tray assembly. Also similar to the embodiment illustrated in FIGS. 1–8, the cover 80 includes at least one different height region 88 along each of the rail portions 84.

The present invention also related to a spring box for transporting the chip tray with a cover positioned adjacent thereto so as to retain the integrated circuit chips in a desired location on the chip tray. An embodiment of the spring box is illustrated at 100 in FIGS. 16–20. The spring box 100 generally includes an upper wall 102, a lower wall 104, a pair of side walls 106 and a bottom wall 108. The upper wall 102, the lower wall 104, the pair of side walls 106 and the bottom wall 108 define a partially enclosed region 110 that is adapted to receive the chip tray and cover assembly (not shown).

A depth, width and height of the partially enclosed region 110 is approximately the same as a length, width and height of the chip tray and cover assembly to retain the chip tray and cover assembly in substantially stationary position in the spring box 100.

The upper wall 102 and the lower wall 104 each preferably include 2 resilient tabs 120 extending therefrom. The resilient tabs 120 partially extend into the partially enclosed region 110 to thereby engage the upper and lower surfaces of the chip tray and cover assembly to retain the chip tray and cover assembly within the partially enclosed region, as most clearly illustrated in FIG. 20. The resilient tabs 120 on the upper wall 102 are preferably positioned opposite the resilient tabs 120 on the lower wall 104.

The upper wall 102 and the lower wall 104 each preferably include a gripping recess 130 formed therein. The gripping recess 130 extends into the upper wall 102 and the lower wall 104 opposite the bottom wall 108 and thereby facilitates placing the chip tray and cover assembly into the partially enclosed region 110 as well as removing the chip tray and cover assembly from the partially enclosed region 110.

Still another embodiment of the present invention is directed to a spring box that is adapted to hold a chip tray and cover assembly that has multiple chip trays in a stacked relationship. A spring box suitable for this application is illustrated at 200 in FIGS. 21–25. The structure of the spring box 200 is preferably substantially the same as the structure of the spring box 100 illustrated in FIGS. 16–20.

Yet another embodiment of the present invention is directed to a storage container illustrated at 300 in FIGS. 26–30. The storage container 300 includes a plurality of storage regions 302 that are each adapted to receive a chip tray and cover assembly (not shown). The storage container 300 thereby facilitates transporting larger numbers of integrated circuit chips.

The storage container 300 includes a plurality of side walls 304 that extend around a base 306. The storage container 300 also includes four interior walls 310 that divide the storage container 300 into the plurality of storage regions 302.

The side walls 304 and the interior walls 310 each include a notch 312 formed therein at an approximately intermediate location of the wall. The notch 312 facilitates placing the chip tray and cover assembly into the storage region 302 and removing the chip tray and storage region from the storage region 302.

Proximate each of the corners in the storage regions 302, a pocket 320 is formed therein. The pocket 320 preferably has a curved surface. The pocket 320 reduces the potential for the chip tray assembly from binding against the walls 304, 310 as the chip tray assembly is placed into and removed from the storage region 302.

It is contemplated that features disclosed in this application, as well as those described in the above applications incorporated by reference, can be mixed and matched to suit particular circumstances. Various other modifications and changes will be apparent to those of ordinary skill.

What is claimed is:

1. A tray for a semiconductors comprising:
    a tray portion having a top horizontal planar surface and a bottom horizontal planar surface, wherein the top horizontal planar surface has a plurality of chip recesses arranged in a matrix formed therein, said chip recesses positioned above the bottom planar surface;
    a rail portion extending substantially around the tray portion and offset downwardly from the top tray portion, wherein the rail portion has a top horizontal planar surface and a bottom horizontal planar surface; and
    an intermediate portion interconnecting the tray portion and the rail portion, wherein the intermediate portion has an outwardly facing surface and an inwardly facing surface, wherein the outwardly facing surface has four planar faces one at each side of the tray, wherein each planar face of the outwardly facing surface extends from the top horizontal planar surface of the tray portion to the top horizontal planar surface of the rail portion, and wherein each of the four planar faces of the outwardly facing surface is oriented at an angle of more than 115° with respect to the rail portion, wherein each of the inwardly facing surfaces has four inward planar faces, each of which extends from the bottom horizontal planar surface of the tray portion to the rail portion and wherein the bottom horizontal surface of the tray portion is generally aligned with the top horizontal surface of the rail portion.

2. The tray of claim 1, wherein the intermediate portion is oriented at an angle of between 115° and 150° with respect to the rail portion.

3. The tray of claim 1, wherein the rail portion has a plurality of reduced thickness regions, wherein the reduced thickness regions have a thickness that is less than 80 percent of a thickness of the rail portion.

4. The tray of claim 3, wherein the reduced thickness regions comprise more than about 33 percent of a length of the rail portion.

5. The tray of claim 1, wherein four inward planar faces of the inwardly facing surface of the intermediate portion are entirely below the plurality of chip recesses and are respectively parallel to the four planar faces of the outwardly facing surface of the intermediate portion.

6. The tray of claim 1, and further comprising at least one nub extending from a lower surface of the tray portion, wherein the at least one nub enables the tray to be used with a jig that is designed for use with a differently sized tray.

7. The tray of claim 1, wherein an upper surface of the tray portion is higher than an upper surface of the intermediate portion and wherein the upper surface of the intermediate portion is higher than an upper surface of the rail portion.

8. A system for storing semiconductors comprising:
    a first chip tray comprising a first tray portion, a first rail portion and a first intermediate portion all integral with one another, wherein the first tray portion has a top planar surface and a bottom planar surface, wherein the top planar surface has a plurality of chip recesses arranged in a matrix formed therein, wherein the first rail portion extends substantially around the first tray portion and is offset downwardly from the first tray portion, wherein the first rail portion has a top planar surface and a bottom planar surface, wherein the first intermediate portion interconnects the first tray portion and the first rail portion, wherein the first intermediate portion has an outwardly facing surface and an inwardly facing surface, wherein the outwardly facing surface has four first planar faces, wherein each first planar face extends from the top planar surface of the first tray portion to the top planar surface of the first rail portion, wherein each first planar face is oriented at an angle of more than 115° with respect to the top planar surface of the rail portion, and wherein a lower surface the bottom planar surface of the first tray portion, the first intermediate portion and the first rail portion define a recess and wherein the bottom horizontal surface of the tray portion is generally aligned with the top horizontal surface of the rail portion; and
    a second chip tray comprising a second tray portion, a second rail portion and a second intermediate portion, wherein the second rail portion extends substantially around the second tray portion, wherein the second intermediate portion interconnects the second tray portion and the second rail portion, and wherein the second intermediate portion is oriented at an angle of more than 115° with respect to the rail portion, wherein the second tray portion seats in the recess to retain semiconductors in desired positions on the second tray portion so that an upper surface of the second tray portion is proximate a lower surface of the first tray portion.

9. The system of claim 8, wherein the first and second rail portions each have a plurality of reduced thickness regions, wherein the reduced thickness regions have a thickness that is less than 80 percent of a thickness of the first and second rail portions.

10. The system of claim 8, wherein the first and second tray each have a length and a width that are both greater than about 3.5 inches.

11. The system of claim 10, wherein upper surfaces of the first and second tray portions each have a deviation in height of less than 0.004 inches.

12. A system for storing semiconductors comprising:

a first chip tray comprising a first tray portion, a first rail portion and a first intermediate portion all integral with one another, wherein the first tray portion has a top planar surface and a bottom planar surface, wherein the top planar surface has a plurality of chip recesses arranged in a matrix formed therein, wherein the first rail portion extends substantially around the first tray portion and is offset downwardly from the first tray portion, wherein the first rail portion has a top planar surface and a bottom planar surface, wherein the first intermediate portion interconnects the first tray portion and the first rail portion, wherein the first intermediate portion has an outwardly facing surface and an inwardly facing surface, wherein the outwardly facing surface has four first planar faces, wherein each first planar face extends from the top planar surface of the first tray portion to the top planar surface of the first rail portion, wherein each first planar face is oriented at an angle of more than 115° with respect to the top planar surface of the rail portion, and wherein a lower surface the bottom planar surface of the first tray portion, the first intermediate portion and the first rail portion define a recess;

a second chip tray comprising a second tray portion, a second rail portion and a second intermediate portion, wherein the second rail portion extends substantially around the second tray portion, wherein the second intermediate portion interconnects the second tray portion and the second rail portion, and wherein the second intermediate portion is oriented at an angle of more than 115° with respect to the rail portion, wherein the second tray portion seats in the recess to retain semiconductors in desired positions on the second tray portion so that an upper surface of the second tray portion is proximate a lower surface of the first tray portion; and a spring box having a recess formed therein that is adapted to receive the first and second chip trays and maintain the first and second chip trays at a substantially stationary position therein.

* * * * *